(12) United States Patent
Netzer et al.

(10) Patent No.: US 6,177,293 B1
(45) Date of Patent: Jan. 23, 2001

(54) METHOD AND STRUCTURE FOR MINIMIZING WHITE SPOTS IN CMOS IMAGE SENSORS

(75) Inventors: Yossi Netzer, Hadera; Ephie Koltin, Givat Elah; Israel Rotstein, Haifa, all of (IL)

(73) Assignee: Tower Semiconductor Ltd., Migdal Haemek (IL)

( * ) Notice: Under 35 U.S.C. 154(b), the term of this patent shall be extended for 0 days.

(21) Appl. No.: 09/315,893

(22) Filed: May 20, 1999

(51) Int. Cl.$^7$ ..................................................... H01L 21/00
(52) U.S. Cl. .................................................................. 438/73
(58) Field of Search .............................. 438/73, 57, 199, 438/66

(56) References Cited

U.S. PATENT DOCUMENTS

| | | |
|---|---|---|
| 5,739,562 | 4/1998 | Achland et al. . |
| 5,781,233 | 7/1998 | Liang et al. . |
| 5,789,774 | 8/1998 | Merrill . |

Primary Examiner—Charles Bowers
Assistant Examiner—Evan Pert
(74) Attorney, Agent, or Firm—Bever, Hoffman & Harms, LLP; Patrick T. Bever

(57) ABSTRACT

A method for forming a CMOS image sensor cell such that stress is minimized in regions surrounding the light sensitive (e.g., photodiode) portion of the cell, thereby reducing leakage current and minimizing white spots in CMOS image sensors. The field oxide surrounding the light sensitive region is formed with interior angles greater than 90° and/or is continuously curved. The reset gate is offset from the light sensitive regions of active pixel cells by a distance greater than 0.25 $\mu$m. A mask is used during n+ doping of the light sensitive region to shield an inner edge of the surrounding field oxide and extends 0.5 $\mu$m or more over the light sensitive region. A mask is provided over the interface between the field oxide and the light sensitive region during sidewall spacer formation. A metal structure contacting the light sensitive region is spaced 0.4 $\mu$m or greater from the surrounding field oxide. Metal lines passing between the light sensitive regions are provided with stress-relieving slits. Metal lines of a guard ring surrounding the pixel array are non-continuous to also provide stress relief.

19 Claims, 12 Drawing Sheets

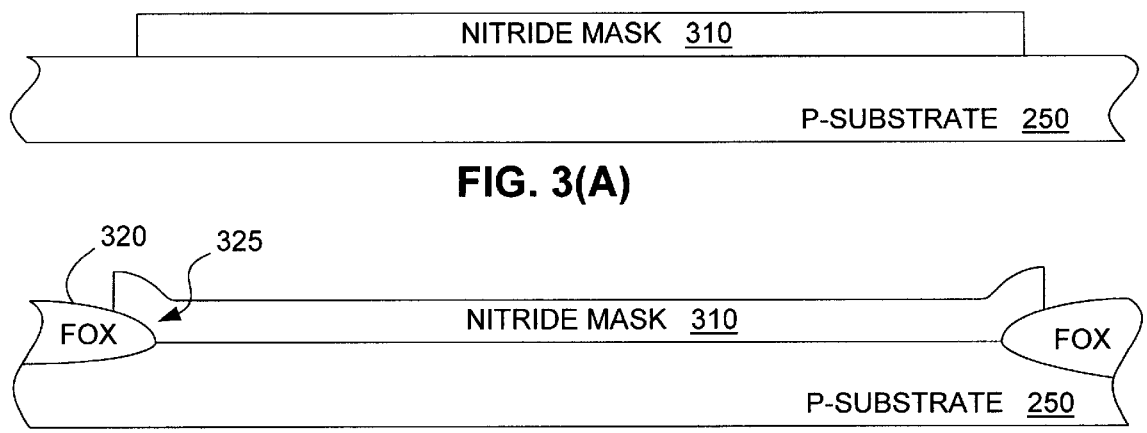
FIG. 3(A)
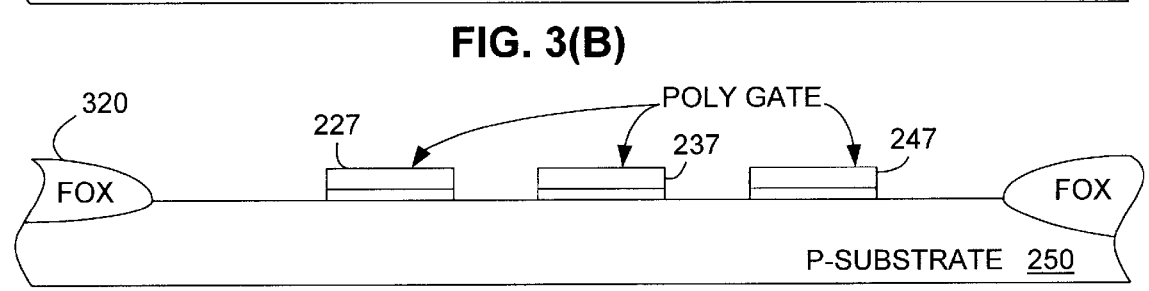
FIG. 3(B)
FIG. 3(C)
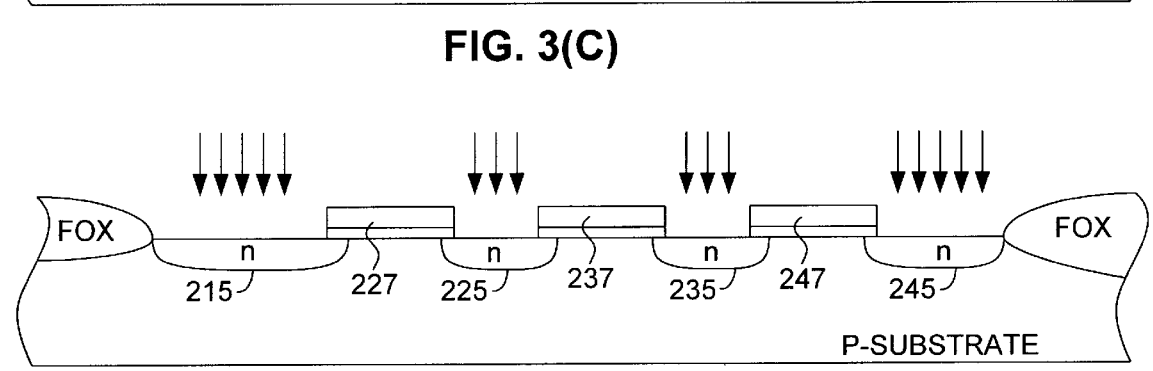
FIG. 3(D)
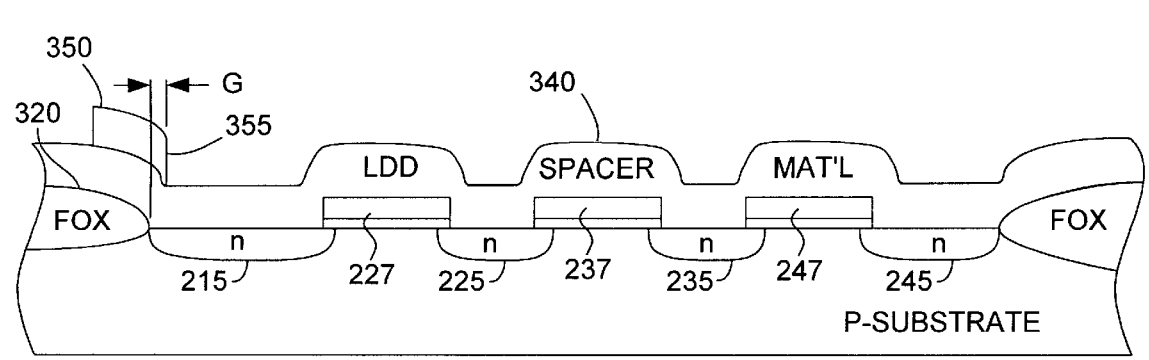
FIG. 3(E)

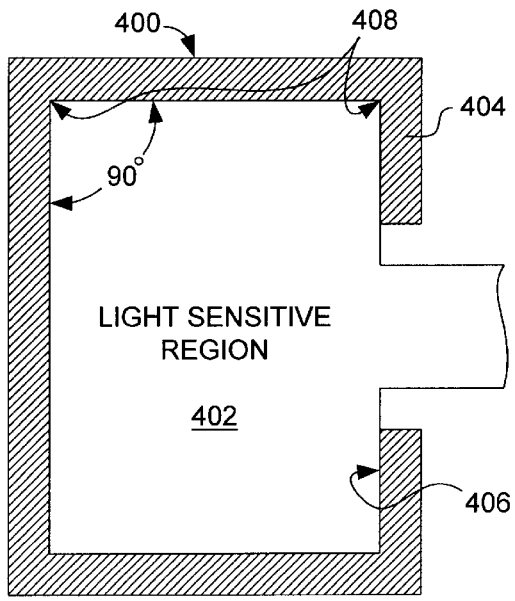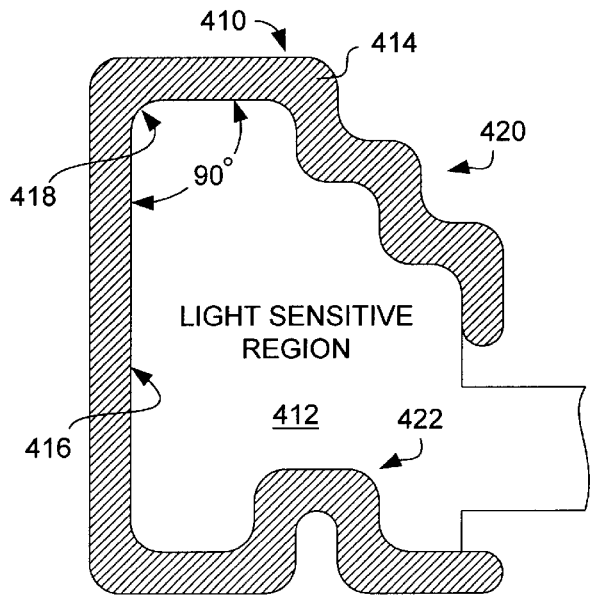
FIG. 4(A) (PRIOR ART)     FIG. 4(B) (PRIOR ART)
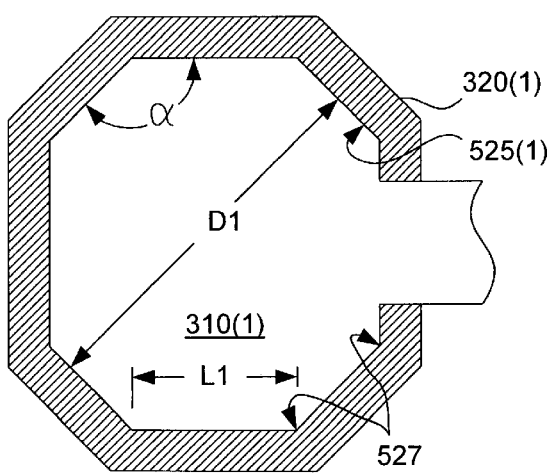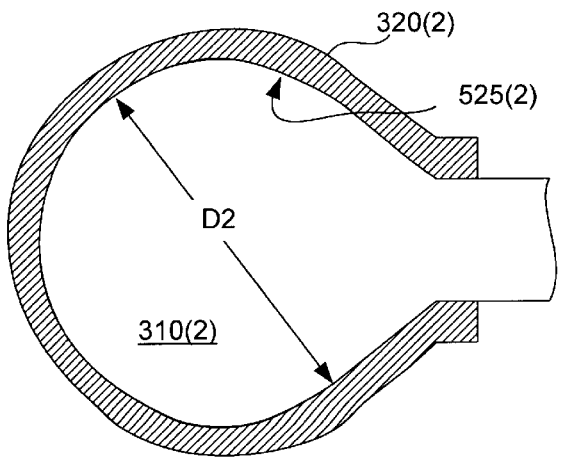
FIG. 5(A)     FIG. 5(B)

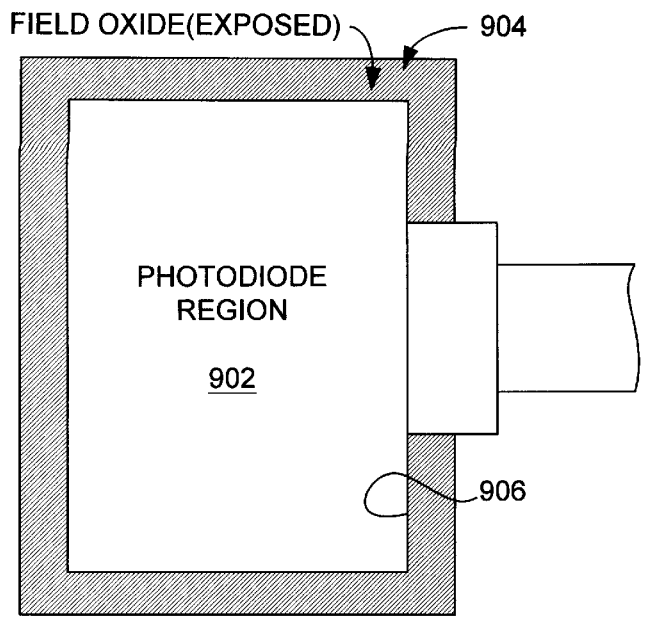
**FIG. 9
(PRIOR ART)**
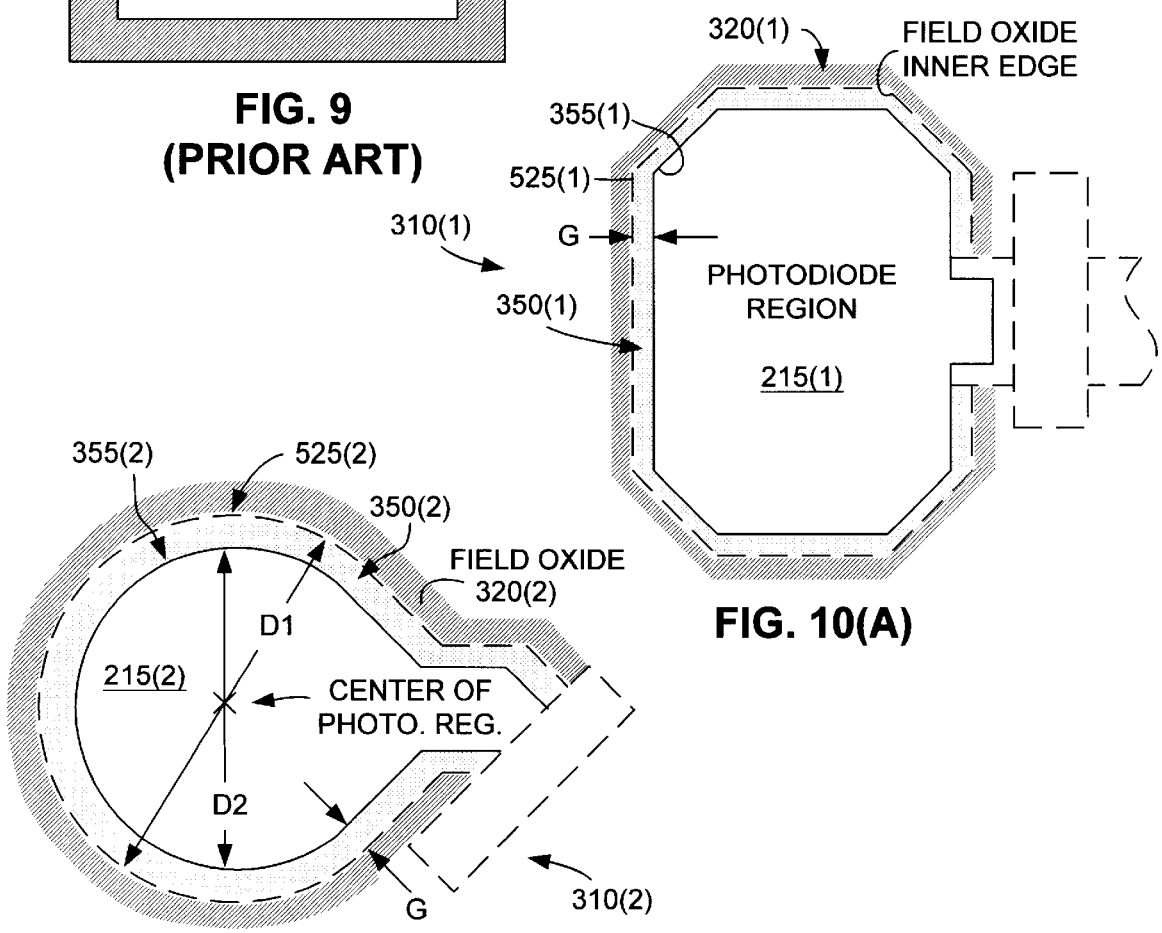
FIG. 10(A)
FIG. 10(B)

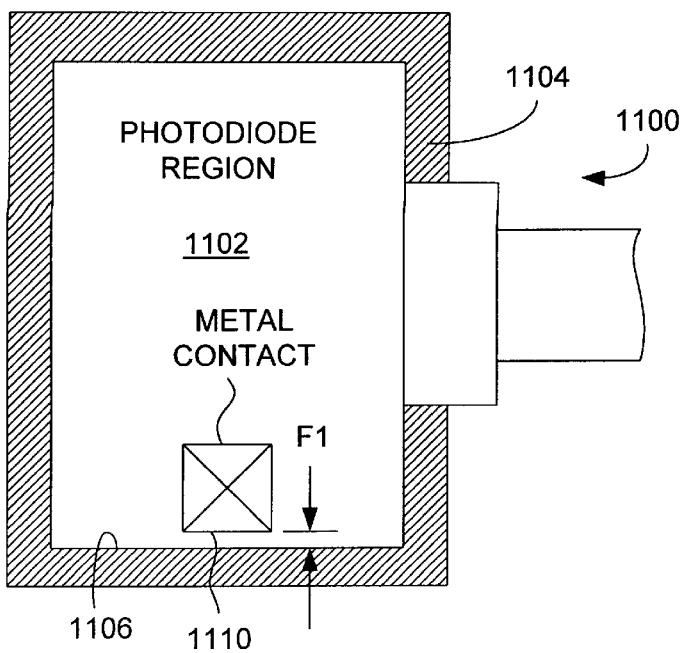
FIG. 11 (PRIOR ART)
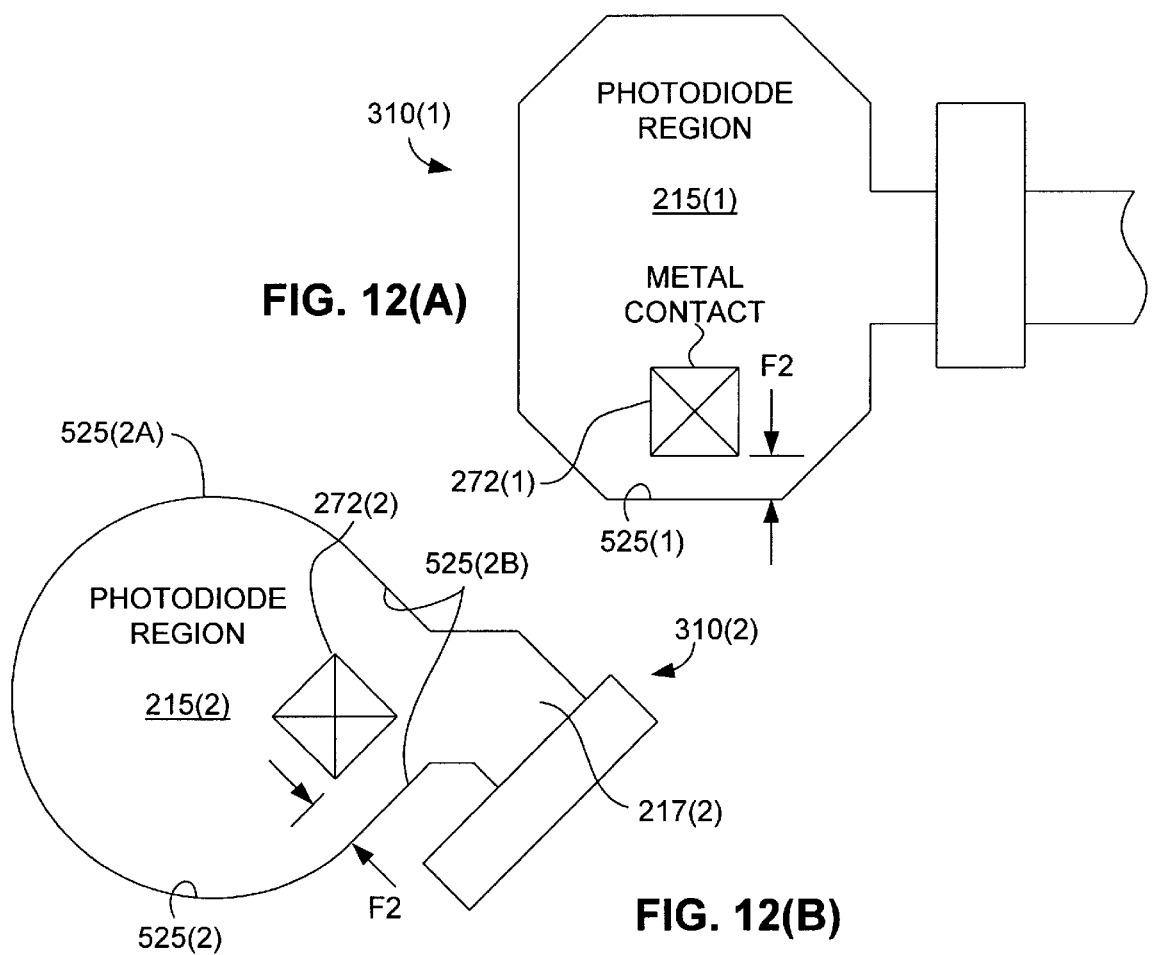
FIG. 12(A)
FIG. 12(B)

METHOD AND STRUCTURE FOR MINIMIZING WHITE SPOTS IN CMOS IMAGE SENSORS

FIELD OF THE INVENTION

The present invention relates to CMOS image sensors. More specifically, the present invention relates to a method and pixel structure designed to reduce excess leakage currents, and to a method for fabricating CMOS image sensors that generate images that are free of white spots.

RELATED ART

Solid state image sensors used in, for example, video cameras are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals are then used to regenerate the optical image on, for example, a display.

CMOS image sensors first appeared in 1967. However, CCDs have prevailed since their invention in 1970. Both solid-state imaging sensors depend on the photovoltaic response that results when silicon is exposed to light. Photons in the visible and near-IR regions of the spectrum have sufficient energy to break covalent bonds in silicon. The number of electrons released is proportional to the light intensity. Even though both technologies use the same physical properties, all-analog CCDs dominate vision applications because of their superior dynamic range, low fixed-pattern noise (FPN), and high sensitivity to light.

More recently, however, CMOS image sensors have gained in popularity. Pure CMOS image sensors have benefited from advances in CMOS technology for microprocessors and ASICs and provide several advantages over CCD imagers. Shrinking lithography, coupled with advanced signal-processing algorithms, sets the stage for sensor array, array control, and image processing on one chip produced using these well-established CMOS techniques. Shrinking lithography should also decrease image-array cost due to smaller pixels. However, pixels cannot shrink too much, or they have an insufficient light-sensitive area. Nonetheless, shrinking lithography provides reduced metal-line widths that connect transistors and buses in the array. This reduction of metal-line widths exposes more silicon to light, thereby increasing light sensitivity. CMOS image sensors also provide greater power savings, because they require fewer power-supply voltages than do CCD imagers. In addition, due to modifications to CMOS pixels, newly developed CMOS image sensors provide high-resolution, low-noise images that compare with CCD imager quality.

CMOS pixel arrays are at the heart of the newly developed CMOS image sensors. CMOS pixel-array construction uses active or passive pixels. Active-pixel sensors (APSs) include amplification circuitry in each pixel. Passive pixels use photodiodes to collect the photocharge, whereas active pixels can include either photodiode or photogate light sensitive regions.

The first image-sensor devices used in the 1960s were passive pixel arrays. Each pixel of a passive pixel array includes a photodiode for converting photon energy to free electrons, and an access transistor for selectively connecting the photodiode to a column bus. After photocharge integration in the photodiode, an array controller turns on the access transistor. The charge stored in the photodiode transfers to the capacitance of the column bus, where a charge-integrating amplifier at the end of the bus senses the resulting voltage. The column bus voltage resets the photodiode, and the controller then turns off the access transistor. The pixel is then ready for another integration period.

Shortcomings still plague passive pixel arrays. The read noise for passive pixels is high, and it is difficult to increase the array's size without exacerbating the noise. Ideally, the sense amplifier at the bottom of the column bus senses each pixels charge equally, independent of the pixel's position on the bus. Realistically, low charge levels from remotely-located pixels provide insufficient energy to charge the distributed capacitance of the column bus. Matching access transistors is also a problem. The turn-on thresholds for the access transistors vary throughout the array, giving non-uniform response to identical light levels. These threshold variations are one cause of FPN.

CMOS active-pixel sensors (APSs) overcome passive-pixel deficiencies by including active circuits (transistors) in each pixel. One type of an active circuit includes a source-follower transistor, a reset transistor and a row-selection transistor. The source-follower transistor buffers the charge transferred to an output (column) bus from the light sensing element (i.e., photodiode or photogate), and provides current to charge and discharge the bus capacitance more quickly. The faster charging and discharging allow the bus length to increase. This increased bus length, in turn, allows an increase in the array size. The reset transistor controls integration time and, therefore, provides for electronic shutter control. The row-select transistor gives half the coordinate-readout capability to the array. Although these transistors would appear to increase the device's power consumption, little difference exists between an active and a passive pixel's power consumption.

A problem associated with CMOS APSs is that adding these active circuits to each pixel reduces the fill factor (i.e., the ratio of light sensing area to total pixel area) of CMOS APS pixel arrays. In response, APS designers have modified the pixel shape to maximize the light sensing area. However, CMOS APS pixel arrays incorporating these modifications often experience white spots in the image generated by a CMOS APS.

What is needed is a method for fabricating pixel sensor structures that minimizes the occurrence of white spots on images produced by CMOS image sensors.

SUMMARY

The present inventors have determined that a significant cause of white spot problems in CMOS image sensors is excessive current leakage from the light-sensitive (e.g., photodiode) regions. In particular, this excessive current leakage appears to occur in regions that are subjected to excessive mechanical stress during fabrication, and to regions that are subjected to excessive electrical stress during device operation.

Accordingly, the present invention provides structures and methods for producing CMOS image sensors that minimize mechanical and electrical stress in the field oxide surrounding the light sensitive regions of the pixels, thereby reducing leakage current and minimizing white spots in the CMOS image sensor.

In accordance with a first aspect of the present invention, the field oxide surrounding the light sensitive region of each pixel is formed with interior angles greater than 90° (with rounded corners), and more preferably with interior angles of 135° or greater. In one embodiment, the field oxide surrounding the light sensitive region is continuously curved. By increasing these interior angles, high stress regions typically created by the localized growth of field oxide at the field oxide/light sensitive region interface is minimized, thereby minimizing leakage current from the light sensitive region.

In accordance with a second aspect of the present invention, the polysilicon structure used to form, for example, the reset transistor gate of each pixel is offset from the light sensitive region by a distance greater than 0.25 μm. The gate structures are typically formed using a plasma etching process. By spacing the gate structures away from the light sensitive region, high stress regions in the field oxide that are typically created during the etching process are minimized. In addition, the electrical field between the light sensitive region and the polysilicon gate of, for example, the reset transistor is reduced. Thus, leakage current from the light sensitive region is minimized.

In accordance with a third aspect of the present invention, a mask is provided over the interface between the field oxide and the light sensitive region during lightly-doped drain (LDD) sidewall spacer formation (etch-back). These LDD spacers are typically formed during an oxide etch step performed using a plasma process that also etches the field oxide. The field oxide etch caused by the plasma process can induce further damage to the sensitive interface between the field oxide and the light sensitive region. Masking the field oxide edge during the formation of LDD spacers eliminates this further damage from this sensitive region, thereby minimizing leakage current from the light sensitive region.

In accordance with a fourth aspect of the present invention, an implant blocking mask is used during heavy (n+) doping of the light sensitive region that completely covers an inner edge of the surrounding field oxide and extends more than 0.5 μm over the light sensitive region. Forming the implant blocking mask over the field oxide surrounding the light sensitive region of the pixel sensor cell shields the edge of the field oxide during heavy doping. As a result, the metallurgical junction is moved away from the stressed field oxide edge and the electrical field in the junction is reduced, thereby minimizing current leakage from the light sensitive region of the pixel sensor cell.

In accordance with a fifth aspect of the present invention, the metal contacting the light sensitive region is spaced 0.4 μm or greater from the surrounding field oxide. The contact via associated with this metal contact is typically formed using a dry plasma etch process that can create excessive damage in regions in the field oxide edge surrounding the light sensitive region. By forming the metal contact 0.4 μm or greater from the field oxide/light sensitive region interface, high stress regions in the field oxide that are caused during the dry plasma etching process are avoided and induced electrical fields in this region are reduced during device operation. As a result, leakage current from the light sensitive region is minimized.

In accordance with a sixth aspect of the present invention, wide metal lines (i.e., metal lines having a width of 30 μm or greater) are provided with stress-relieving slits. During normal process cycles, these metal lines are subjected to thermal expansion and contraction that can create high stress regions in the underlying layers. By providing narrow (e.g., 2.5 μm wide) slits in these metal lines, the amount of stress transferred to the underlying layers is greatly reduced, thereby minimizing leakage current from the light sensitive region of the pixel sensor cell.

In accordance with a seventh aspect, a guard ring surrounding the pixel array is formed with non-continuous metal lines. Guard rings are typically provided around the light sensitive pixel array of an associated sensor circuit to provide electrical isolation, and include continuous diffusions and overlying metal lines. The present inventors have determined that, during normal processing cycles, the metal lines located over the guard ring diffusions are subjected to thermal expansion and contraction that can create high stress regions in underlying layers. To avoid these highs stress regions, metal line segments of the guard ring are separated at the corners of the pixel array by a gap of, for example, 0.7 μm or greater. This gap is provided at each of the corners of the pixel array. By insuring the metal segments of the guard ring are non-continuous, the amount of stress transferred to the underlying layers is greatly reduced, thereby minimizing the leakage current from the light sensitive regions of the pixel array.

The present invention will be more fully understood in view of the following description and drawings.

BRIEF DESCRIPTION OF THE DRAWINGS

FIGS. 3(A) through 3(I) are cross-sectional views showing process steps associated with the formation of a CMOS APS cell in accordance with a first embodiment of the present invention;

FIGS. 4(A) and 4(B) are plan views showing exemplary peripheral shapes of field oxide/photodiode regions associated with conventional CMOS APS cells;

FIGS. 5(A) and 5(B) are plan views showing peripheral shapes of field oxide/photodiode regions associated with CMOS APS cells in accordance with a first aspect of the present invention;

FIG. 9 is a plan view showing the placement of an exemplary implant mask utilized during heavy (n+) doping of the photodiode region of conventional CMOS APS cells;

FIGS. 10(A) and 10(B) are plan views showing the placement of exemplary implant masks utilized during heavy (n+) doping of the photodiode region of CMOS APS cells in accordance with a fourth aspect of the present invention;

FIG. 11 is a plan view showing an exemplary spacing between a metal contact of a photodiode region and a surrounding field oxide in a conventional CMOS APS cell;

FIGS. 12(A) an 12(B) are plan views showing exemplary spacing between metal contacts and surrounding field oxide boundaries of CMOS APS cells in accordance with a fifth aspect of the preset invention;

DETAILED DESCRIPTION

The present inventors have determined that a significant cause of white spots in CMOS image sensors is due to high current leakage from the light sensitive (e.g., photodiode) regions of the pixels. In particular, this high current leakage appears to occur in regions that are subjected to excessive mechanical stress during fabrication, and subjected to excessive electrical stress during device operation.

The following description provides structures and methods for producing CMOS image sensors in accordance with various aspects of the present invention that minimize stress (both mechanical and electrical) in regions surrounding the photodiode of each pixel. When these structures/methods are utilized to produce CMOS image sensors using submicron (e.g., 0.5 $\mu$m) CMOS processes, the cumulative effect is a significant decrease in white spot occurrences. Each of the structures/methods associated with the various aspects is believed to contribute to this significant decrease.

The present invention is described below with reference to CMOS active-pixel sensors (APSs), and in particular to three-transistor CMOS APSs utilizing photodiode light sensitive regions. However, the methods and structures described below may also be used to produce passive CMOS image sensors and CMOS APSs utilizing photogate light sensitive regions. In addition, the methods and structures may be used to produce CMOS APSs having any number of transistors (e.g., one, four or five). Moreover, the present inventors believe the methods and structures of the present invention may also be used to produce MOS pixel arrays.

Figure 1:
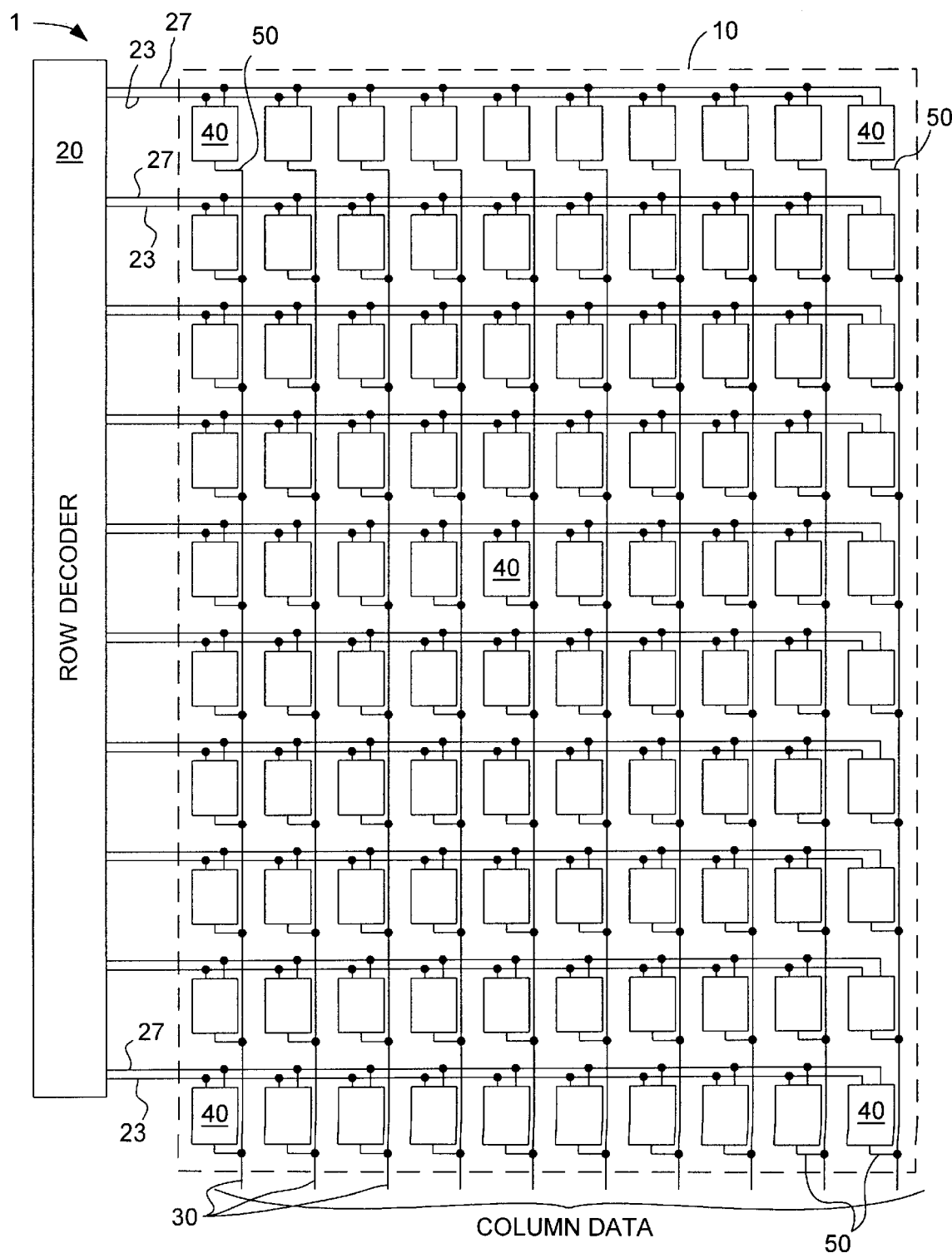
FIG. 1 is a schematic diagram of an active pixel sensor array.

FIG. 1 shows a CMOS APS 1 that includes a pixel array 10, a row decoder 20 and a plurality of column data (bus) lines 30. Pixel array 10 includes closely spaced APS cells (pixels) 40 that are arranged in rows and columns. Pixel array 10 is depicted as a ten-by-ten array for illustrative purposes only. Pixel arrays typically consist of a much larger number of pixels (e.g., 1280-by-1024 arrays). Moreover, the pixels may be arranged in patterns other than rows and columns.

Each APS cell 40 of pixel array 10 includes a light sensing element that is capable of converting a detected quantity of light into a corresponding electrical signal at an output terminal 50. The pixels in each row are connected to a common reset control line 23 and a common row select control line 27. The pixels in each column are connected through respective output terminals 50 to common column data lines 30.

In operation, a timing controller (not shown) provides timing signals to row decoder 20 that sequentially activates each row of APS cells 40 via reset control lines 23 and row select control lines 27 to detect light intensity and to generate corresponding output voltage signals during each frame interval. A frame, as used herein, refers to a single complete cycle of activating and sensing the output from each APS cell 40 in the array a single time over a predetermined frame time period. The timing of the imaging system is controlled to achieve a desired frame rate, such as 30 frames per second. The detailed circuitry of the row decoder 20 is well known to one ordinarily skilled in the art.

When detecting a particular frame, each row of pixels may be activated to detect light intensity over a substantial portion of the frame interval. In the time remaining after the row of APS cells 40 has detected the light intensity for the frame, each of the respective pixels simultaneously generates output voltage signals corresponding to the amount of light detected by that APS cell 40. If an image is focused on the array 10 by, for example, a conventional camera lens, then each APS cell 40 generates an output voltage signal corresponding to the light intensity for a portion of the image focused on that APS cell 40. The output voltage signals generated by the activated row are simultaneously provided to the column output line 30 via output terminals 50.

Figure 2A:
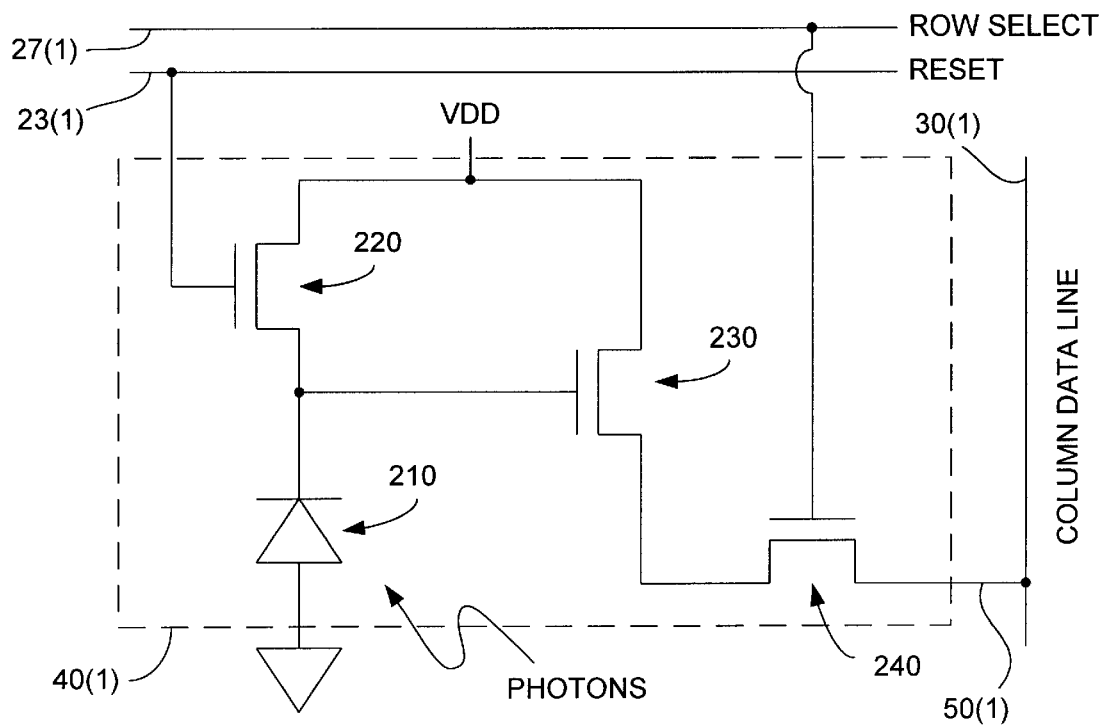
FIGS. 2(A) and 2(B) are simplified schematic and cross-sectional views showing a three-transistor CMOS APS cell formed with a photodiode light sensitive element.
Figure 2B:
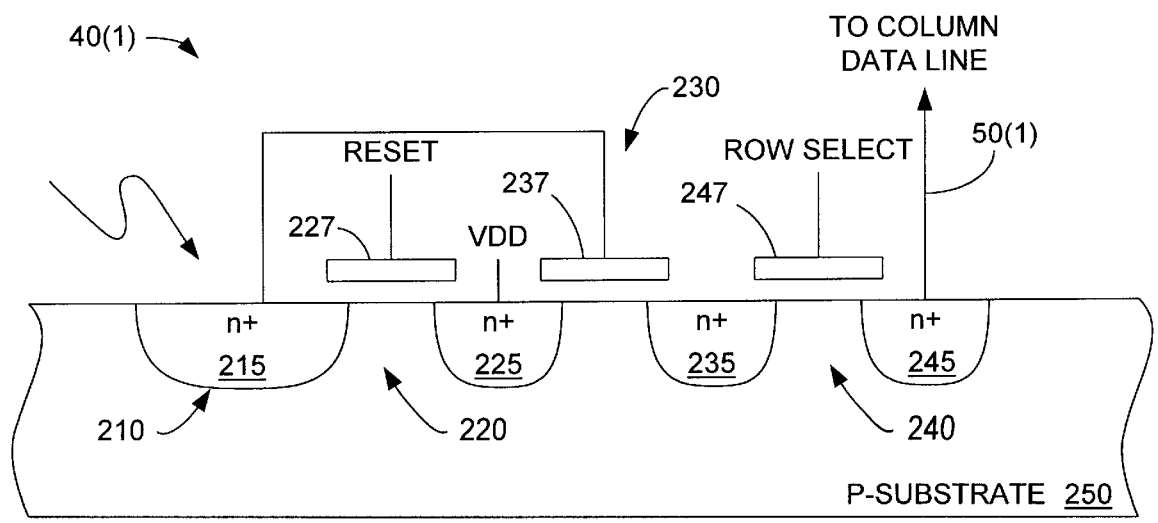

FIGS. 2(A) and 2(B) are simplified schematic and cross-sectional views showing an APS cell 40 (1). APS cell 40 (1) includes a photodiode 210, a reset transistor 220, an amplifier formed by a source-follower transistor 230, and a select transistor 240. Reset transistor 220 includes a gate connected to reset control line 23 (1), a first terminal connected to a voltage source $V_{DD}$ (e.g., 5 volts), and a second terminal connected to a terminal of photodiode 210 and to the gate of source-follower transistor 230. Source-follower transistor 230 has a first terminal connected to voltage source a second terminal connected to a first terminal of select transistor 240. Select transistor 240 has a gate connected to row select control line 27(1) and a second terminal connected to column data line 30(1) via output terminal 50(1).

FIG. 2(B) shows a simplified cross-section of APS cell 40(1) in accordance with an embodiment of the present invention. In this embodiment, APS cell 40(1) is formed in a P-type substrate 250 using known CMOS techniques. Photodiode 210 is formed in a first n-type diffusion (light sensitive) region 215. Voltage source $V_{DD}$ is applied to a second n-type diffusion region 225 that is spaced from photodiode region 215. A first polysilicon gate structure 227 is provided over the space between diffusion region 225 and photodiode region 215 to collectively form reset transistor 220. A third n-type diffusion region 235 is spaced from second region 225, and a second polysilicon gate structure 237 is formed over this space. Photodiode 210 is connected to second polysilicon gate 237 using a metal line to form source-follower transistor 230. A fourth n-type diffusion region 245 is spaced from third region 235, and a third polysilicon gate structure 247 is formed over this space to form select transistor 240. Fourth diffusion region 245 is connected via metal line to output terminal 50(1).

APS cell 40(1) is depicted as an n-channel device with electrons as the photo-generated charge carriers. In an alternative embodiment (not shown), an APS cell may be formed as a p-channel device with holes as the photo-generated charge carriers. For the balance of this description, the APS cells are assumed to be n-channel devices.

APS cell 40(1) operates in an integration and readout phase that is controlled by signals received on reset control line 23(1) and row select control line 27(1). Reset transistor 220 is pulsed on and off during the integration phase. This reset process causes the potential of photodiode region 215 to float at a reset level approximately equal to $V_{DD}$ less the threshold voltage of reset transistor 220. Photodiode 210 inherently includes capacitance to store an amount of charge proportional to the light intensity reflected from an object. The photogenerated current discharges the pixel capacitance and causes the potential of the photodiode 210 to decrease from its value of approximately $V_{DD}$ to another value, the signal value, which is dictated by the amount of photogenerated charge. The difference between the reset and signal levels is proportional to the incident light and constitutes the video signal. Photodiode 210 is buffered from the output terminal 50 by source-follower transistor 230. Select transistor 240 is used to select the pixel for read-out.

FIGS. 3(A) through 3(I) are cross-sectional views showing process steps associated with the formation of an APS cell in accordance with a first embodiment of the present invention. The process steps shown in these figures are simplified to selectively illustrate novel aspects of the present invention. Additional process steps that are necessary to generate CMOS image sensors are well known, and are therefore omitted for brevity.

FIGS. 3(A) and 3(B) are a cross-sectional side views respectively depicting the formation of a nitride mask 310 on substrate 250, and the subsequent growth of field oxide regions 320 on unmasked portions of substrate 250.

Nitride mask 310 is formed from a nitride layer deposited on p-type substrate 250 using known techniques. Nitride mask 310 defines photodiode region 215 and other active circuit regions of an APS cell 40 (see FIG. 2(B)). Field oxide 320 is then grown using known techniques. As shown in FIG. 3(B), lateral oxide growth forms an oxide edge 325 (indicated with a bird's beak shape) that lifts nitride mask 310 along its periphery. This thinner and stressed oxide edge 325 defines the interface between the field oxide and the active regions, such as the light sensitive photodiode region (discussed below).

FIGS. 4(A) and 4(B) are plan views showing exemplary peripheral shapes of field oxide/photodiode regions associated with conventional APS cells 400 and 410. Conventional APS cells 400 and 410 are described below for the purpose of distinguishing a first novel aspect of the present invention.

Referring to FIG. 4(A), conventional APS cell 400 includes a substantially rectangular photodiode region 402 that is surrounded by field oxide 404. An interface 406 between photodiode region 402 and field oxide 404 defines an outer periphery of photodiode region 402 and an inner periphery of field oxide 404, and has a substantially rectangular shape. As such, interface 406 defines an inner peripheral edge of field oxide 420 that includes straightline sections meeting at corners 408 at 90° angles.

Referring to FIG. 4(B), conventional APS cell 410 includes a photodiode region 412 and a surrounding field oxide 414 meeting at an interface 416. Interface 416 includes corners 418 at intersections of straight-line sections of field oxide 414. In addition, interface 416 includes complex sections 420 and 422 that are stepped (stair shaped) so as to provide a maximum fill factor. The stepped shapes of complex sections 420 and 422 are utilized to maximize the fill factor by extending the photodiode region 412 into all areas not occupied, for example, by the active circuits of the pixel, or not covered by upper metal lines (not shown). That is, in order to maximize the fill factor, photodiode region 412 is formed in as much unoccupied/uncovered substrate area as possible, thereby producing the complex sections 420 and 422.

The present inventors have determined that the fabrication of the field oxide to define the 90° corners and complex shapes associated with conventional photodiode regions 400 and 410 results in relatively higher stresses than the stress generated along the straight line sections of interface 406 and 416. The mechanism mainly responsible for these relatively higher stresses is believed to be lateral oxide growth in orthogonal directions at these corners that lifts the overlying nitride layer. These regions of relatively high stress are believed to cause high leakage current that, in extreme cases, produces white spots in CMOS image sensors.

In accordance with a first aspect of the present invention, in order to minimize the relatively high stress, the interface between the field oxide and the photodiode region of each pixel is shaped such that all straight-line portions form angles that are greater than 90° and include rounded corners. For example, the interface can have a pentagonal shape in which equal-length straight-line portions meet at angles of 108°. Preferably, the interface includes eight or more corners having angles that are 135° or greater. Although forming field oxide 320 such that these corners are greater than 90° produces photodiode regions that do not occupy the greatest possible amount of semiconductor space, the reduction in stress produced in accordance with the present invention is believed to significantly improve CMOS image sensor performance.

FIGS. 5(A) and 5(B) are plan views showing peripheral shapes of exemplary field oxide/photodiode regions associated with CMOS APS cells in accordance with the first aspect of the present invention.

FIG. 5(A) shows a nitride mask portion 310(1) formed over substrate 250 (see FIG. 3(B)) after the formation of field oxide 320(1). Nitride mask portion 310(1) is formed in an octagonal shape with a portion extending from the octagon corresponding with the channel region provided for a reset transistor. By forming nitride mask portion 310(1) in this manner, an interface 525(1) is produced on an inner peripheral edge of field oxide 320(1) such that all straight-line sections meet at corners 527 at angles that are equal to 135°. As discussed below, the region masked by nitride mask portion 310(1) is subsequently doped to produce a photodiode region that extends to interface 525(1). Nitride mask portion 310(1) has a minimum diameter D1 that is determined by the size of a contact, which is defined by the specific technology design rules used to fabricate the CMOS APS cells, and the required overlap of active (diffusion) area over the contact as defined by the fifth aspect (discussed below). In addition, the diameter D1 of nitride mask portion 310(1) is partially determined by the amount of overlap of the protective mask utilized in accordance with the third aspect of the present invention (discussed below). For example, when a CMOS APS cell is fabricated using a 0.5 $\mu$m technology, assuming a contact size of 0.5 $\mu$m and an active mask overlap of 0.4 $\mu$m, the diameter D1 may be 1.3 $\mu$m.

FIG. 5(B) shows a nitride mask portion 310(2) formed over substrate 250 (see FIG. 3(B)) after the formation of field oxide 320(2). Nitride mask portion 310(2) is formed to include a continuously inwardly curving portion that substantially surrounds the subsequently formed photodiode region. By forming nitride mask portion 310(2) in this manner, an interface 525(2) is produced on an inner peripheral edge of field oxide 320(2) such that excessive field oxide stress is substantially reduced. As discussed below, the region masked by nitride mask portion 310(2) is subsequently doped to produce a photodiode region that extends to interface 525(2). Like the diameter D1 of the nitride mask shown in FIG. 5(A), the diameter D2 of nitride mask portion 310(2) is partially determined by the amount of overlap of the protective mask utilized in accordance with the third aspect of the present invention (discussed below).

FIG. 3(C) is a cross-sectional side view depicting the formation of polysilicon gate structures 227, 237 and 247 that are associated with reset transistor 220, source-follower transistor 230 and row-select transistor 240 (see FIG. 2(B)). Polysilicon gate structures 227, 237 and 247 are formed on gate oxide material using known processing techniques, but are spaced relative to the photodiode region in the manner set forth below.

Figure 6:
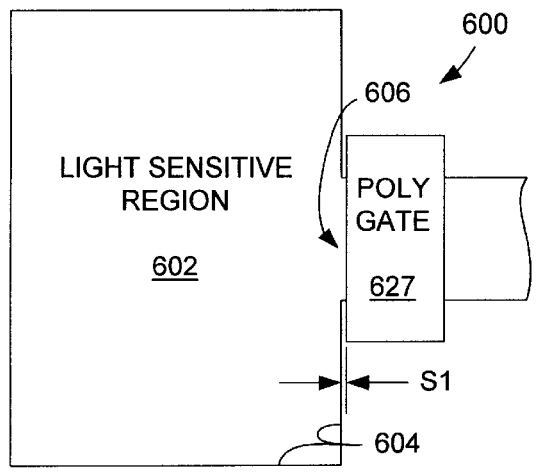
FIG. 6 is a plan view showing an exemplary reset gate/photodiode region offset associated with conventional CMOS APS cells.

FIG. 6 is a plan view showing an exemplary reset gate/photodiode region offset associated with a conventional CMOS APS cell 600. An APS cell 600 is described herein for the purpose of distinguishing a second novel aspect of the present invention.

Referring to FIG. 6, APS cell 600 includes a photodiode region 602 having a peripheral edge 604 that is at least partially surrounded by field oxide (not shown). Located on a side of photodiode region 602 is a protruding diffused region 606 that forms a source region of a reset transistor. Formed over protruding diffused region 606 is a reset transistor gate structure (POLY GATE) 627. Based on known practices directed toward maximizing the fill factor of each cell, reset poly gate 627 is located a lateral distance Si in the range of 0 to 0.2 µm from peripheral edge 604 of photodiode region 602.

The present inventors have determined that several factors combine to produce leakage current from photodiode region 602 of conventional CMOS APS 600. The proximity of the polysilicon gates, such as reset gate 627, to the photodiode region 602 generates a strong electrical field between these polysilicon gates and the photodiode region. In addition, the polysilicon etch process that is used to form the polysilicon gates, such as reset gate 627, causes further damage and increased weakness at portions of peripheral edge 604, which is already relatively weak and stressed due to field oxide formation. The present inventors have determined that the combination of electrical field/stress with the increased weakness of peripheral edge 604 increases leakage current from photodiode region 602. In extreme cases, the leakage current due to these stresses causes cell failure, thereby producing white spots in CMOS image sensors.

In accordance with a second aspect of the present invention, in order to minimize the relatively high stress in the field oxide located adjacent to the interface between the polysilicon gate structures and the photodiode region of each pixel, all polysilicon gate structures are offset (spaced away from) the main body of the photodiode region by a distance of 0.25 µm or greater. Of course, this offset does not apply to the narrow diffused region protruding from the photodiode region that forms a source of the reset transistor. Although spacing the reset transistor gate away from the photodiode region by a distance greater than 0.25 µm produces a pixel that may not provide the greatest fill factor, the reduction in field oxide stress reduces current leakage from the photodiode region. In addition, by positioning the reset transistor at a distance greater than 0.25 µm, the electric field between the reset gate structure and the photodiode region is reduced. Thus, CMOS image sensors produced in accordance with the second aspect of the present invention exhibit reduced leakage current, which significantly improves sensor performance.

Figure 7A:
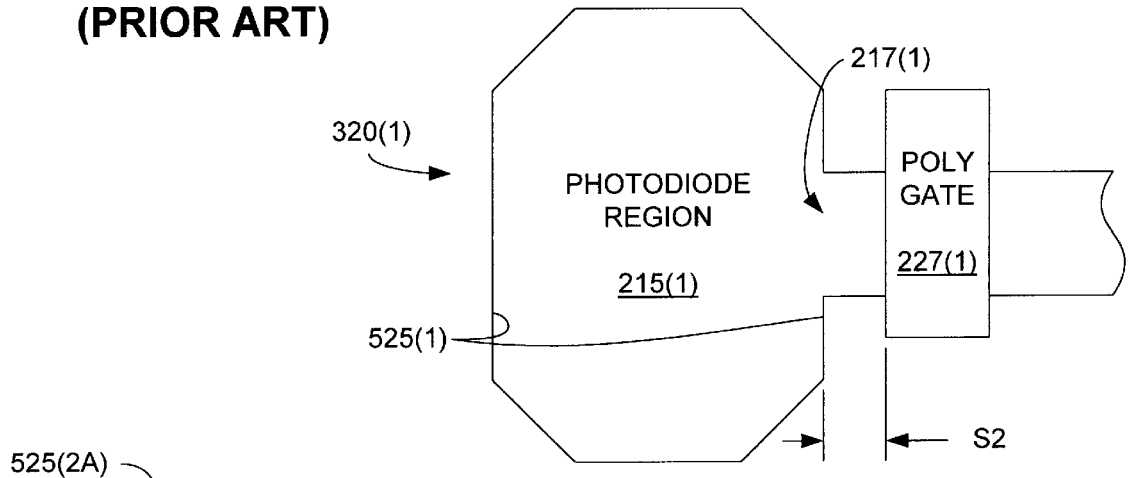
FIGS. 7(A) and 7(B) are plan views showing exemplary reset gate/photodiode region offsets associated with CMOS APS cells in accordance with a second aspect of the present invention.
Figure 7B:
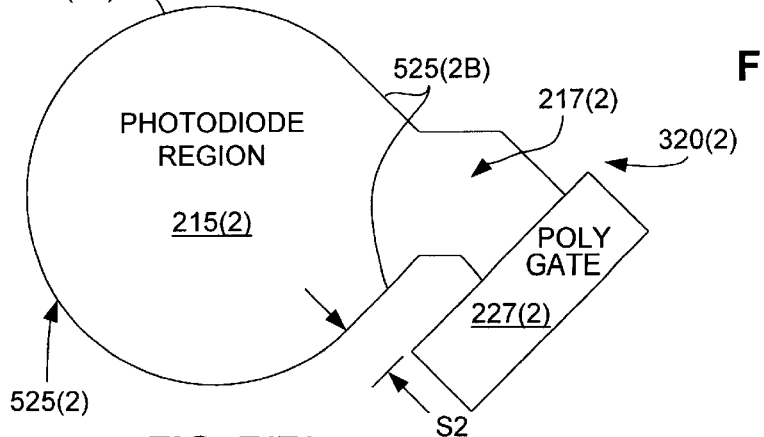

FIGS. 7(A) and 7(B) are plan views showing exemplary reset gate/photodiode region offsets associated with APS cells in accordance with a second aspect of the present invention.

FIG. 7(A) shows a partially-formed APS cell 320(1) including a photodiode region 215(1) (before doping) and an interface 525(1) between a peripheral edge of photodiode region 215(1) and surrounding field oxide (not shown). Located on a side of photodiode region 215(1) is a protruding diffused region 217(1) that forms a source region of reset transistor 220 (see FIG. 2(B)). Formed over protruding diffused region 217(1) is a reset transistor gate structure (POLY GATE) 227(1). In accordance with the second aspect of the present invention, reset poly gate 227(1) is located a lateral distance S2 that is greater than 0.25 µm from the interface 525(1) of photodiode region 215(1). Even more preferably, lateral distance S2 is in the range of 0.25 to 1.3 µm (using 0.5 µm processing technology).

FIG. 7(B) shows a partially-formed APS cell 320(2) including a photodiode region 215(2) and an interface 525(2) between a peripheral edge of photodiode region 215(2) and surrounding field oxide (not shown). Interface 525(2) includes a continuously-curved portion 525(2A) and two straight-line portions 525(2B) extending in a "V" shape to the continuously-curved portion 525 (2A). A protruding diffused region 217(2) extends from the narrow end of the "V" shaped portion formed by straight-line portions 525(2B) and forms a source region of reset transistor 220 (see FIG. 2(B)). Formed over protruding diffused region 217(2) is a reset transistor gate structure (POLY GATE) 227(2). In accordance with the second aspect of the present invention, reset poly gate 227(2) is located a lateral distance S2 that is greater than 0.25 µm from one of the straight-line portions 525(2B) of interface 525(2). Even more preferably, lateral distance S2 is in the range of 0.25 to 1.3 µm.

The above description of the second aspect assumes that the closest polysilicon structures to the photodiode region are the reset transistor gate and the source-follower gate structure 237. Of course, the disclosed offset also applies to row select gate structure 247 (see FIG. 2(B)) and to any other polysilicon structures formed near photodiode region 215 (see FIG. 2(B)).

Referring to FIG. 3(D), light doping is performed into the exposed surface areas of substrate 250 that are associated with photodiode region 215, reset transistor diffused region 225, source-follower diffused region 235 and row select transistor diffused region 245. Polysilicon gate structures 227, 237 and 247 mask the channels separating these regions during the light doping process, which is performed using conventional techniques.

Referring to FIG. 3(E), after the light doping process shown in FIG. 3(D), a lightly-doped drain (LDD) spacer material 340, such as $SiO_2$ is deposited using known techniques. A photoresist mask 350 is then formed on a portion of LDD spacer material 340 and is patterned using known techniques to include an opening overlying photodiode region 215. As discussed below with respect to third and fourth aspects of the present invention, mask 350 is provided to prevent stress formation in the field oxide/photodiode interface region that occurs during the formation of sidewall spacers and heavy doping procedures. To perform these functions, mask 350 is provided with an outer diameter that is larger than a diameter of photodiode region 215, and an inner diameter that is smaller than the diameter of photodiode region 215. As such, mask 350 overlaps the interface between photodiode region 215 and field oxide 320 by a distance G that is greater than 0.5 µm.

Figure 3F:
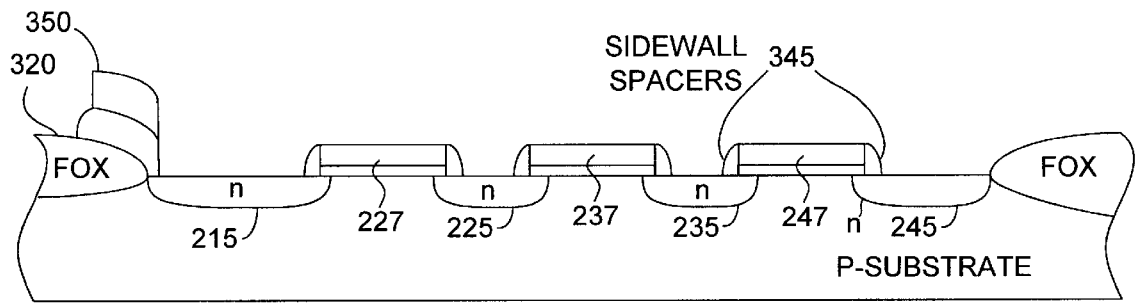

Next, as depicted in FIG. 3(F), LDD spacer material 340 is etched to form LDD sidewall spacers 345 on the side surfaces of reset gate 227, source-follower gate 237 and row-select gate 247. In accordance with the third aspect of the present invention, the peripheral edge of photodiode region 215 is shielded by mask 350 during the etching process used to form sidewall spacers 345. Photoresist mask 350 is removed after this etchback process. The benefits derived from the third aspect are described by comparison with conventional practices shown in FIGS. 8(A) and 8(B).

Figure 8A:
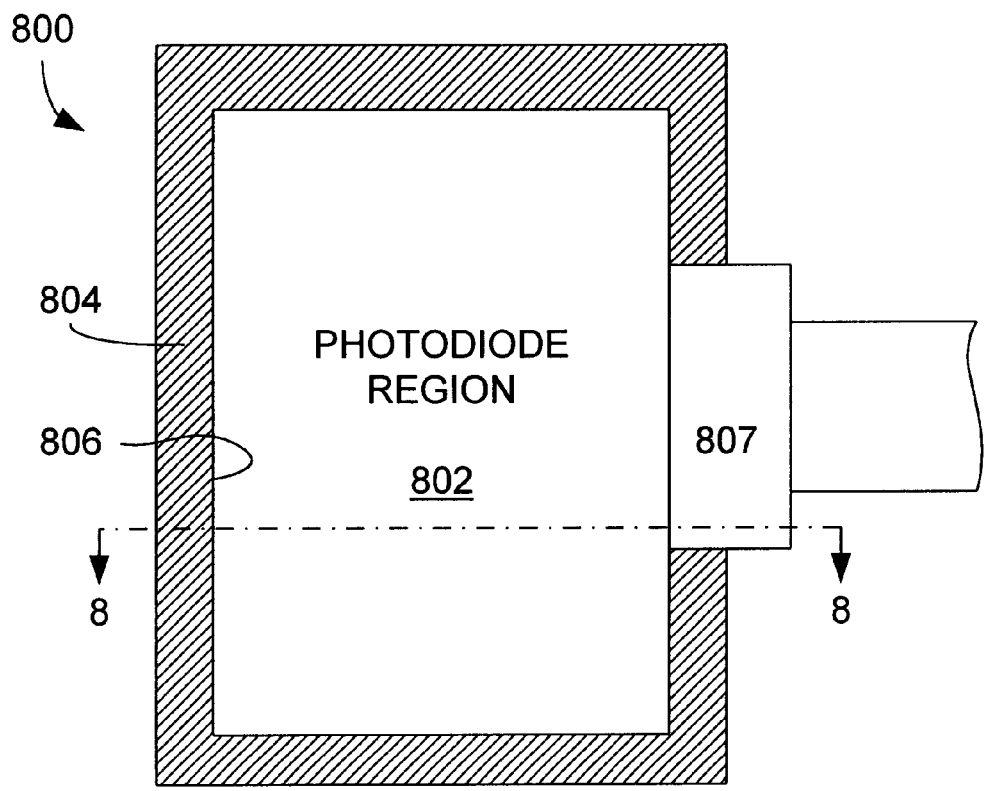
FIGS. 8(A) and 8(B) are plan and cross-sectional views showing damage to the field oxide/photodiode region interface caused by LDD spacer formation in conventional CMOS APS cells that is addressed by a third aspect of the present invention.
Figure 8B:
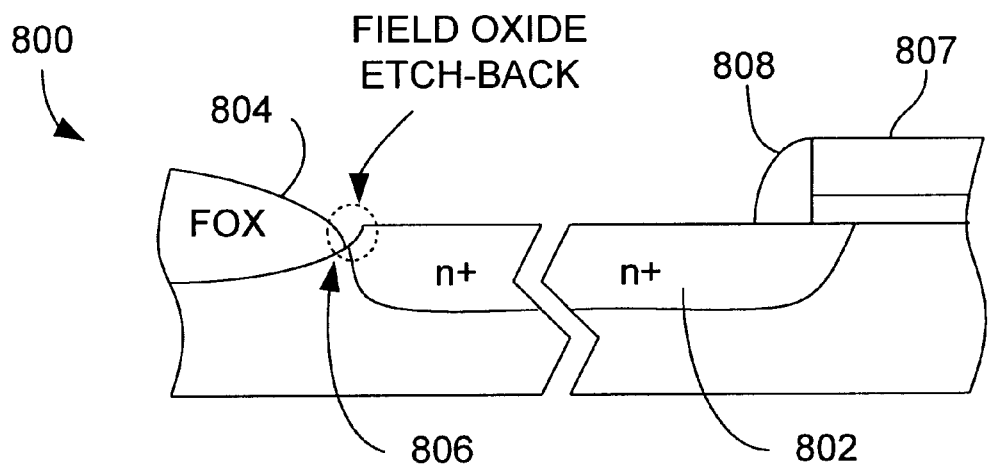

FIGS. 8(A) and 8(B) are plan and cross-sectional side views showing a conventional photodiode 800. Conventional photodiode 800 is described herein for the purpose of distinguishing the third novel aspect of the present invention. Referring to FIG. 8(B), which is a section view taken along line 8—8 of FIG. 8(A), conventional photodiode 800 includes a photodiode active region 802 having a peripheral edge that is at least partially surrounded by field oxide 804 such that an interface 806 is formed between photodiode region 802 and field oxide 804. A reset gate 807 is located over a portion of photodiode region 802. Based on conventional practices, sidewall spacers, such as sidewall spacer 808 shown in FIG. 8(B), are formed using a plasma oxide etch process. As indicated in FIG. 8(B), while etching the LDD spacer material to form sidewall spacers 808, the present inventors believe the plasma etching process can induce further damage to portions of interface 806 between field oxide 804 and photodiode region 802. As a result, regions that are already initially stressed suffer from additional stress resulting in high leakage currents from photodiode region 802.

Returning to FIGS. 3(E) and 3(F), in accordance with the third aspect of the present invention, mask 350 overlaps photodiode region 215 by a distance G that is greater than 0.5 $\mu$m, thereby shielding the interface between field oxide 320 and photodiode region 215 during the formation of LDD sidewall spacers 345, which have a width of approximately 0.2 $\mu$m. Specifically, because the interface between field oxide 320 and photodiode region 215 is shielded from the plasma etching process used to form sidewall spacers 345, etchback damage to this interface during LDD sidewall spacer formation is eliminated. As a result, stress is minimized, thereby minimizing leakage current from photodiode region 215.

Figure 3G:
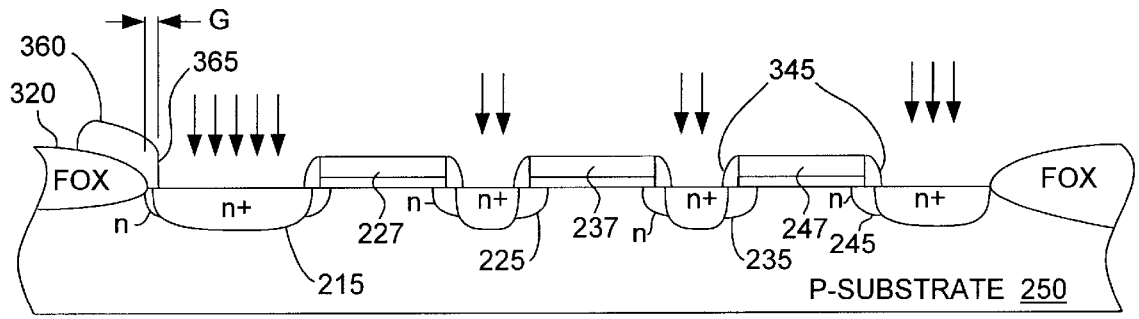

Turning now to FIG. 3(G), mask 350 is removed after etchback using known techniques such that a residual oxide portion 360 (formed from the LDD spacer material) remains over the interface between field oxide 320 and photodiode region 215. In one embodiment, oxide portion 360 preferably has a thickness in the range of 1800 to 2000 Å. A heavy (n+) doping procedure (which is indicated by the downward pointing arrows) is then performed using conventional ion implant processes. Specifically, heavy doping is performed through exposed surface areas of substrate 250 that are associated with photodiode region 215, reset transistor diffused region 225, source-follower diffused region 235 and row select transistor diffused region 245. Sidewall spacers 345 limit migration of the n+ dopant in the regions adjacent to polysilicon gate structures 227, 237 and 247, thereby leaving these regions lightly (n) doped.

As indicated in FIG. 3(G), after mask 350 is removed, oxide portion 360 overlaps the interface between photodiode region 215 and field oxide region 320. In accordance with a fourth aspect of the present invention, oxide portion 360 shields the periphery of photodiode region 215 during the heavy doping procedure. The benefits derived from the fourth aspect are described by comparison with conventional practices shown in FIG. 9.

FIG. 9 is a plan view showing the placement of an exemplary implant mask utilized during heavy (n+) doping of the photodiode region of a conventional CMOS cell 900. Conventional APS cell 900 includes a photodiode region 902 having a peripheral edge that is at least partially surrounded by field oxide 904 such that an interface 906 is formed between photodiode region 902 and field oxide 904. Based on conventional practices, field oxide 904 and interface 906 are exposed during the heavy doping process. Note that this conventional practice utilizes field oxide 904 to self-align the implanted heavy (n+) dopant.

The present inventors have determined that the segregation of dopants at the stressed edges of field oxide 904 creates weak points in photodiode region 902 at interface 906. These weak points degrade the electrical performance of photodiode region 902, causing high leakage current that, in extreme cases, produces white spots in CMOS image sensors.

Referring again to FIG. 3(G), in accordance with the fourth aspect of the present invention, the heavy doping of photodiode region 215 by high-energy ion implant (depicted by downward pointing arrows) is performed using oxide portion 360 (which is defined by mask 350, see FIG. 3(F)) to shield the interface between field oxide 320 and photodiode region 215. Specifically, as shown in FIG. 3(G), oxide portion 360 is located over field oxide 320, and extends a distance G over the interface between field oxide 320 and photodiode region 215. In one embodiment, the distance G covered by oxide portion 360 (measured laterally from an inner edge 365 and the interface between field oxide 320 and photodiode region 215) is greater than 0.5 $\mu$m. By forming oxide portion 360 to completely cover the interface between field oxide 320 and photodiode region 215, this interface (which extends around the periphery of photodiode region 215) is shielded during the heavy doping process, thereby positioning the metallurgical junction (i.e., the inner edge of the n+ dopant) away from the inner edge of field oxide 320. As a result, electrical stress in the interface region is reduced, and current leakage from photodiode region 215 is minimized.

FIGS. 10(A) and 10(B) are plan views showing the placement of exemplary masks utilized during heavy (n+) doping of the photodiode region of active pixel sensor cells in accordance with the fourth aspect of the present invention.

FIG. 10(A) shows a partially-formed APS cell 310(1) including a photodiode region 215(1) and an interface 525(1) between a peripheral edge of photodiode region 215(1) and surrounding field oxide 320(1). In accordance with the fourth aspect, mask 350(1) is formed over field oxide 320(1), and extends over photodiode region 215(1) to an inner edge 355(1) that is a distance G of 0.5 $\mu$m or greater from interface 525(1).

FIG. 10(B) shows a partially-formed APS cell 310(2) including a photodiode region 215(2) and an interface 525(2) between a peripheral edge of photodiode region 215(2) and surrounding field oxide 320(2). Interface 525(2) includes a continuously-curved portion 535(2A) defining photodiode region diameter D1 (discussed above). In accordance with the fourth aspect, mask 350(2) completely covers field oxide region 320(1), and extends over photodiode region 215(2) to an inside edge 355(2) such that inner diameter D2 of mask 350(2) is smaller than the diameter D1 of interface 535(2).

Figure 3H:
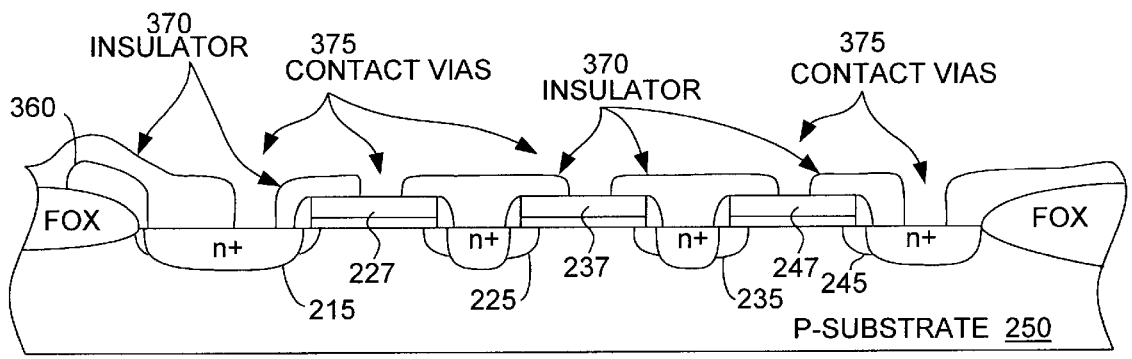
Figure 3I:
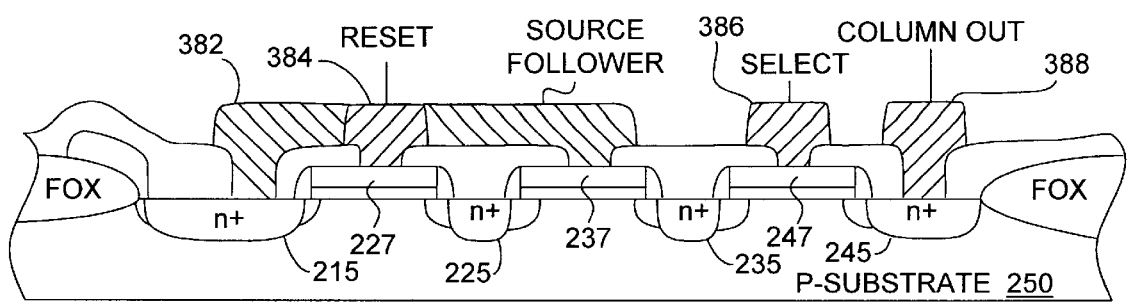

FIGS. 3(H) and 3(I) are a cross-sectional side views respectively depicting the formation of insulating material 370 over oxide portion 360 and the regions doped in the step depicted in FIG. 3(G), and the subsequent formation of metal contacts. In particular, FIG. 3(H) depicts an APS cell after the deposition of an insulating material 370 (such as SiO$_2$), and the subsequent formation of openings (vias) 375 through insulating material 370 that provide access to selected doped regions and gate structures of the APS cell. Subsequent metalization, shown in FIG. 3(I), is performed using known techniques. In particular, FIG. 3(I) depicts an APS cell after the formation of metal contact structures 382, 384, 386 and 388 that extend through vias 375 and contact the exposed portions of substrate 250 and the polysilicon gate structures. Specifically, metal contact structure 382 forms the source follower that extends between photodiode region 215 and polysilicon gate structure 237, metal contact structure 384 forms a terminal portion of the reset line that contacts polysilicon gate structure 227, metal contact structure 386 forms a terminal portion of the select line that contacts polysilicon gate structure 247, and metal contact structure 388 forms a terminal portion of the column out line that contacts n+ diffusion region 245.

FIG. 11 is a plan view showing an exemplary spacing between a metal contact to a photodiode region and a surrounding field oxide in a conventional APS cell 1100. Conventional APS cell 1100 is described herein for the purpose of distinguishing a fifth novel aspect of the present invention (discussed below).

Referring to FIG. 11, an APS cell 1100 includes a photodiode region 1102 that is surrounded by field oxide 1104. An interface 1106 between photodiode region 1102 and field oxide 1104 defines an outer periphery of photodiode region 1102 and an inner periphery of field oxide 1104, and has a substantially rectangular shape. A metal contact structure 1110 extends vertically through a contact via (i.e., a hole formed in insulating material deposited over photodiode region 1102) to contact photodiode region 1102. Based on conventional practices directed toward maximum fill factors, metal contact structure 1110 is located a lateral distance F1 in the range of 0 to 0.25 μm from interface 1106.

A dry plasma etch process is typically used to form the contact via through which metal contact 1110 contacts photodiode region 1102. The present inventors have determined that this dry plasma etch process can cause excessive damage in regions of field oxide 1104 located adjacent to the contact via. The proximity of metal contact 1110 to interface 1106 also increases an electrical field in these regions that causes high leakage current from photodiode region 1102 and, in extreme cases, produces white spots.

In accordance with a fifth aspect of the present invention, each photodiode metal contact structure is offset (spaced away from) the field oxide/photodiode interface by a distance of 0.4 μm or greater in order to reduce induced electrical fields in the field oxide regions adjacent to these contact structures. Spacing the metal contact structures away from this interface also minimizes field oxide damage during contact via formation. Thus, by spacing the metal contacts away from the interface by a distance of 0.4 μm or greater, field oxide damage and high stress regions are minimized, and induced electric fields during device operation are reduced. As a result, leakage current from the light sensitive region is minimized.

FIGS. 12(A) and 12(B) are plan views showing exemplary metal contact/photodiode region offsets associated with APS cells in accordance with the fifth aspect of the present invention.

FIG. 12(A) shows a partially-formed APS cell 310(1) including a photodiode region 215(1) and an interface 525(1) between a peripheral edge of photodiode region 215(1) and surrounding field oxide (not shown). Formed on photodiode region 215(1) is a metal contact structure 272(1) that extends vertically from photodiode region 215(1) (i.e., perpendicular to the plane of the figure). In accordance with the fifth aspect, metal contact structure 272(1) is located a lateral distance F2 that is at least 0.4 μm from the interface 535(1) of photodiode region 215(1). Even more preferably, lateral distance F2 is greater than 0.4 μm.

FIG. 12(B) shows a partially-formed APS cell 310(2) including a photodiode region 215(2) and an interface 525(2) between a peripheral edge of photodiode region 215(2) and surrounding field oxide (not shown). Interface 525(2) includes a continuously-curved portion 525(2A) and two straight-line portions 525(2B) extending in a "V" shape to the continuously-curved portion 525 (2A). A protruding diffused region 217(2) extends from the narrow end of the "V" shaped portion formed by straight-line portions 525(2B) and forms a source region of reset transistor 220 (see FIG. 2(B)). Formed on photodiode region 215(2) is a metal contact structure 272(2). In accordance with the fifth aspect of the present invention, metal contact structure 272(2) is located a lateral distance F2 that is at least 0.4 μm from the straight-line portions 525(2B) of interface 525(2).

Figure 13A:
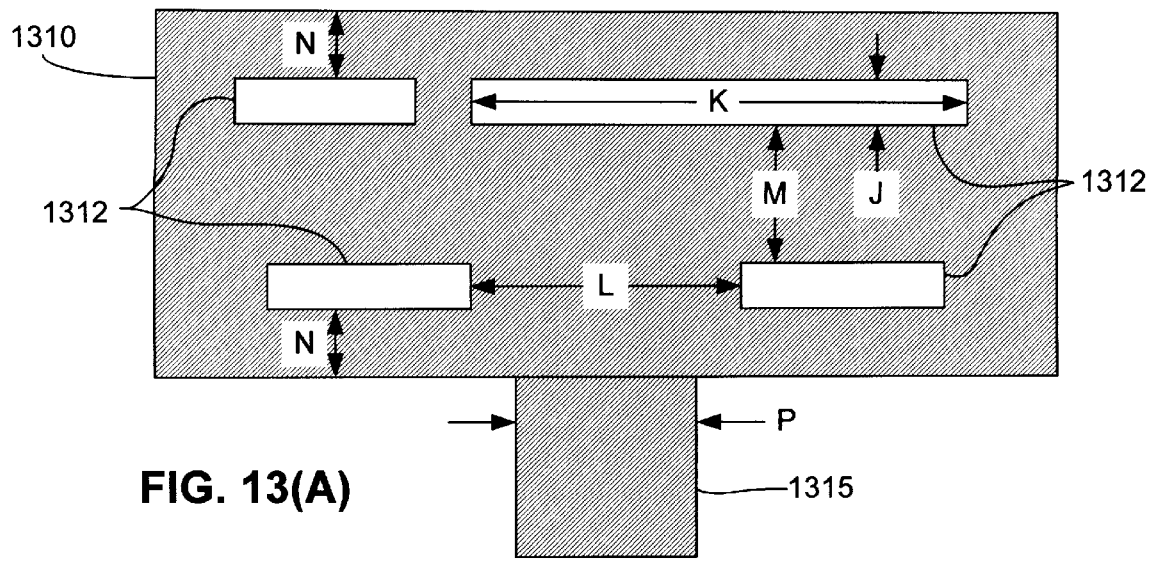
FIGS. 13(A) and 13(B) are plan views showing exemplary metal lines formed in accordance with a sixth aspect of the present invention.
Figure 13B:
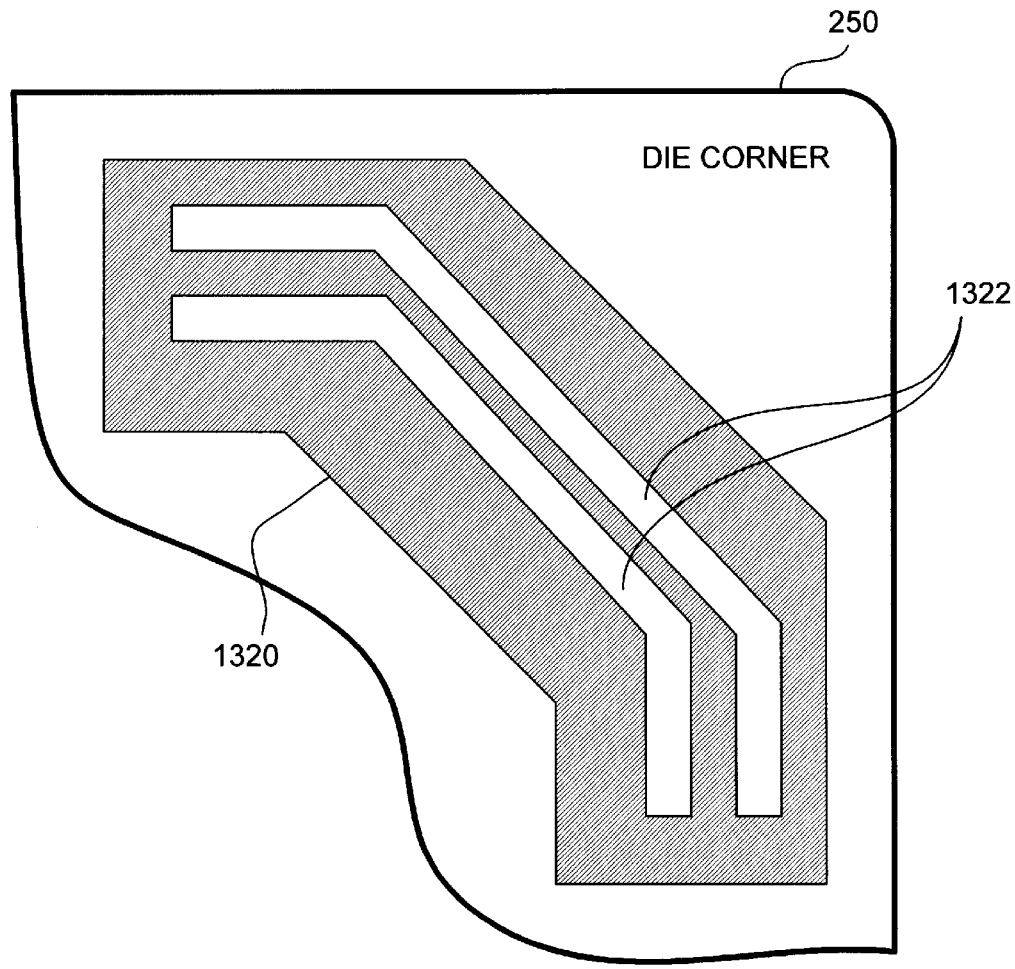
Figure 13C:
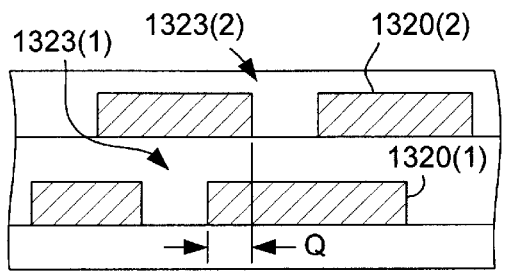
FIG. 13(C) is a sectional side view showing exemplary metal lines formed in accordance with the sixth aspect.

FIGS. 13(A), 13(B) and 13(C) are plan views respectively showing exemplary metal lines 1310 and 1320 formed in accordance with a sixth aspect of the present invention.

Referring to FIG. 13(A), in accordance with the sixth aspect, wide metal line 1310 (i.e., a metal line having a width of 30 μm or greater) is provided with stress-relieving slits 1312. During normal process cycles, metal line 1310 is subjected to thermal expansion and contraction that stresses the layers. The present inventors have determined that these stresses generate regions of relatively high stress that generate excessive leakage current from underlying photodiode regions. By providing narrow slits 1312 in metal line 1310, the amount of stress transferred to the layers located under metal line 1310 is greatly reduced, thereby minimizing leakage current from the photodiode regions of the active pixel sensor. Specifically, stress relieving slits 1312 have minimum a slit width J of 2.5 μm, and a length K in the range of 25 to 500 μm. A maximum distance L between coaxial slits 1312 is 10 μm, and a maximum distance M between any two parallel slits 1312 is 10 μm. A minimum clearance N between any slit 1312 and an edge of metal line 1310 is 10 μm. A minimum width P of a metal line 1315 connected to wide metal line 1310 is 10 μm. No slit is placed opposite metal line 1315. With these dimensions, substantial stress reduction is provided that is believed to significantly reduce field oxide stress.

Referring to FIG. 13(B), wide metal line 1320 (i.e., a metal line having a width of 30 μm or greater) that is located at a corner of substrate 250 is directed at 450 to provided stress relief. In addition, stress relieving slits 1322 are provided in wide metal line 1320 in accordance with the dimensions discussed above with respect to FIG. 13(A). When wide metal line 1320 is formed with 450 bends and associated slits 1322, substantial stress reduction is provided that is believed to significantly reduce field oxide stress.

As shown in FIG. 13(C), a minimum distance Q is provided between slits 1323(1) and 1323(2) formed by adjacent metal layers (e.g., metal line 1320(1) of Metal 1 and metal line 1320(2) of Metal 2) is 2.5 μm.

Figure 13D:
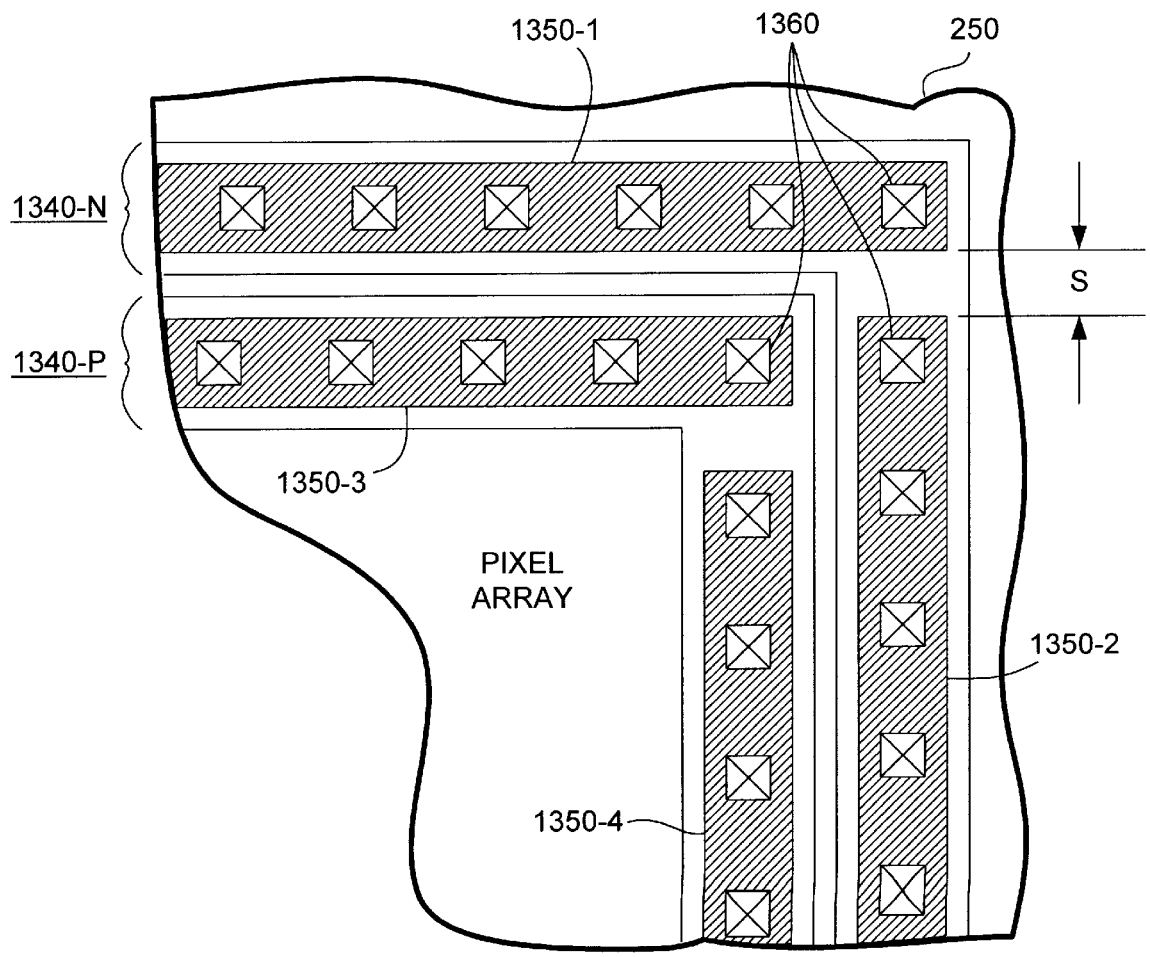
FIG. 13(D) is a plan view showing an exemplary guard ring formed in accordance with a seventh aspect of the present invention.

FIG. 13(D) is a plan view showing a portion of a guard ring formed in accordance with a seventh aspect of the present invention.

Guard rings are typically provided around the light sensitive pixel array of an associated sensor circuit to provide electrical isolation, and include continuous diffusions and overlying metal lines. The present inventors have determined that, during normal processing cycles, the metal lines located over the guard ring diffusions are subjected to thermal expansion and contraction that can create high stress regions in underlying layers. Because expansion and contraction is greatest along the length of the metal line segments, these high stress regions are typically located at the corners of the pixel array. As discussed above, these high stress regions can result in leakage currents that produce white spots.

Referring to FIG. 13(D), the guard ring includes an N+ composite (guard ring diffusion) 1340-N formed along a peripheral edge of substrate 250 and includes perpendicular segments meeting a corner, and a P+ composite (guard ring diffusion) 1340-P formed immediately inside of N+ composite 1340-N. N+ composite 1340-N is connected to a first power supply (e.g., Vcc, not shown), and P+ composite 1340-P is connected to a second power supply (e.g., Vss, also not shown). The guard ring includes metal line segments 1350-1 and 1350-2 formed over N+ composite 1340-N, each metal line segment having an end extending over the corner defined by N+ composite 1340-N. Similarly, metal lines 1350-3 and 1350-4 are formed over P+ composite 1340-P. Metal contacts 1360 extend vertically (i.e., perpendicular to the plane of the figure) between respective metal lines and underlying guard ring diffusions (i.e., N+ composite 1340-N and P+ composite 1340-P). Metal contacts 1360 extend through vias formed in insulating material deposited on substrate 250 using known techniques.

In accordance with the seventh aspect, to minimize stress, the metal lines associated with the guard ring are separated at the corners of the pixel array. For example, as shown in FIG. 13(D), the ends of metal line segments 1350-1 and 1350-2 located over the corner defined by N+ composite 1340-N are separated by a gap Q, which in one embodiment is the minimum spacing allowed by fabrication design rules (e.g., 0.7 μm or greater). Similarly, metal lines 1350-3 and 1350-4 are separated by a gap located over a corner defined by P+ composite 1340-P. These gaps are provided at each of the corners of the pixel array. By insuring the metal segments of the guard ring are non-continuous, the amount of stress transferred to the underlying layers is greatly reduced, thereby minimizing the leakage current from the light sensitive regions of the pixel array.

Although the invention has been described in connection with several embodiments, it is understood that this invention is not limited to the embodiments disclosed, but is capable of various modifications which would be apparent to a person skilled in the art. For example, although the process steps associated with the first embodiment utilize a single mask 350 to shield the interface between photodiode region 215 and field oxide 320 during both LDD spacer formation and heavy doping processes, it is possible to perform these process steps in a different order.

FIGS. 14(A) through 14(D) are cross-sectional views showing process steps associated with forming LDD spacers and performing heavy doping in accordance with a second embodiment of the present invention. Portions of CMOS APS cell 40(2) that correspond to like portions of CMOS APS cell 40(1) (see FIG. 2(B)) are identified with like reference numerals.

Figure 14A:
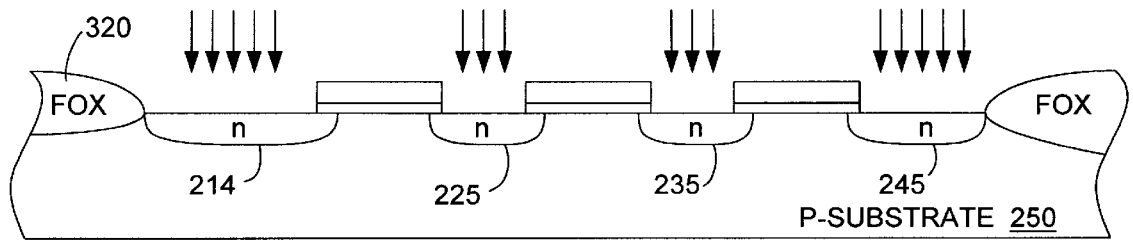
FIGS. 14(A) through 14(D) are cross-sectional views showing process steps associated with formation of a CMOS APS cell in accordance with a second embodiment of the present invention.

Referring to FIG. 14(A), the process steps of the second embodiment begin with self-aligned light (n) doping in photodiode region 214, reset transistor diffused region 225, source-follower diffused region 235 and row select transistor diffused region 245.

Figure 14B:
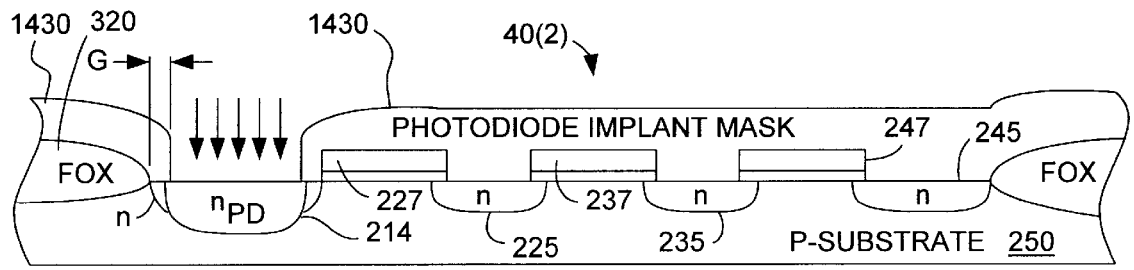

Referring now to FIG. 14(B), a photodiode mask 1430 is then deposited over P-substrate 250, and a window is formed over photodiode region 214. Note that the photodiode implant mask extends a distance G over photodiode region 214 for reasons described above with respect to the fourth aspect of the present invention. Subsequently, heavy doping is then performed through the window, thereby providing a heavy doping ($n_{pD}$) in photodiode region 214.

Figure 14C:
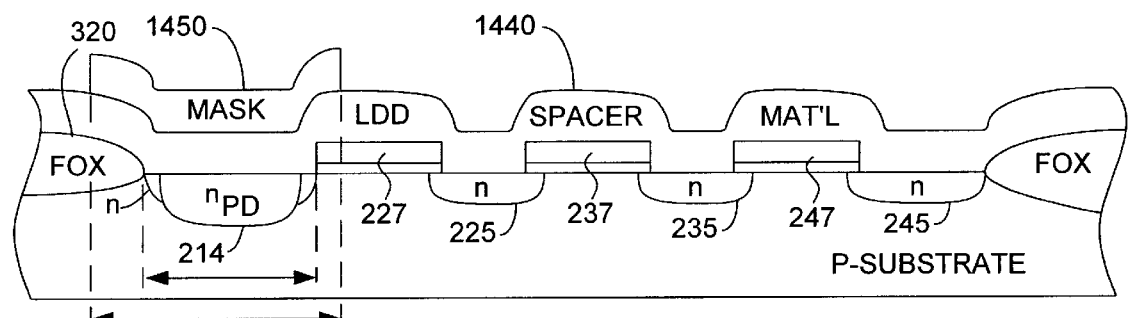

FIG. 14(C) shows subsequent processing in which LDD spacer material 1440 is formed over polysilicon gate portions 227, 237 and 247 and field oxide 320, and then an implant blocking mask 1450 is formed on LDD spacer material 1440. As indicated in FIG. 14(C), mask 1450 completely overlays photodiode region 214.

Figure 14D:
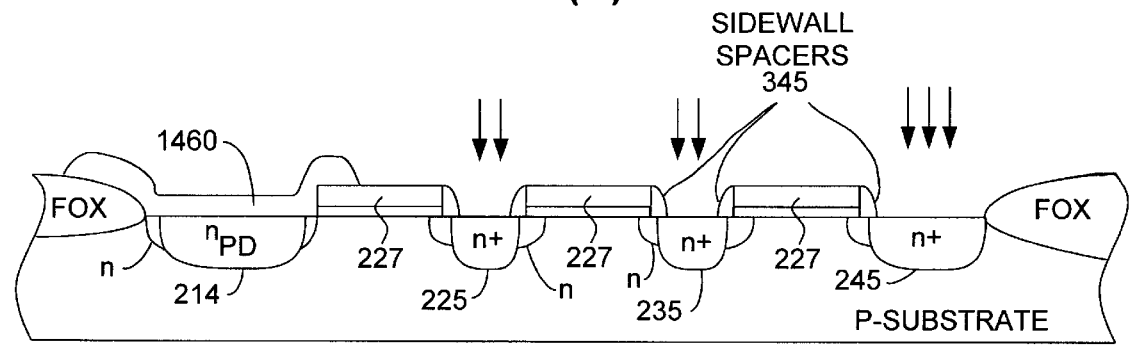

FIG. 14(D) depicts both the formation of sidewall spacers 345 and the heavy doping of reset transistor diffused region 225, source-follower diffused region 235 and row select transistor diffused region 245. Similar to the use of mask 350 in the third aspect of the first embodiment (discussed above), mask 1450 protects photodiode region 214 from damage during sidewall spacer formation during which LDD spacer material 1440 is etched to form sidewall spacers 345. Mask 1450 is removed after sidewall spacer formation, leaving an oxide layer 1460 that protects photodiode region 214 during the heavy (n+) doping of reset transistor diffused region 225, source-follower diffused region 235 and row select transistor diffused region 245.

Other modifications to the disclosed process and structures are also possible. For example, disclosed process parameters have been described with respect to the fabrication of photodiode sensors, it is understood that the process steps may also be utilized in the fabrication of photogate sensors. Thus, the invention is limited only by the following claims.

What is claimed is:

1. A method for fabricating a CMOS image sensor to minimize the occurrence of white spots, the method comprising the steps of:

depositing a mask portion over a substrate;

forming a field oxide around the mask portion such that an inner peripheral edge of the field oxide surrounds a central region of the substrate;

removing the mask portion from the substrate; and doping the central region of the substrate to form a light sensitive region having an interface that is produced along the inner peripheral edge of field oxide;

wherein the interface includes adjoining sections that meet at angles that are greater than 90°.

2. The method according to claim 1, wherein the sections of the interface include straight-line sections that meet at angles of 135° or greater.

3. The method according to claim 2, wherein the interface forms an octagonal shape having sections that meet at angles of 135° or greater.

4. The method according to claim 1, wherein the sections of the interface form a continuously curving portion.

5. A method for fabricating a CMOS image sensor to minimize the occurrence of white spots, the method comprising the steps of:

forming a field oxide structure on a substrate such that the field oxide structure has an inner peripheral edge;

forming a polysilicon structure adjacent to the inner peripheral edge of the field oxide structure; and doping an area of the substrate located within the inner peripheral edge of the field oxide structure to form a photodiode region and a protruding diffused region that extends from the photodiode region to the polysilicon structure, wherein the polysilicon structure is spaced from the photodiode region by a distance greater than 0.25 µm.

6. The method according to claim 5, wherein the step of forming the polysilicon structure comprises depositing a polysilicon layer and etching the polysilicon layer using a plasma etching process.

7. A method for fabricating a CMOS image sensor to minimize the occurrence of white spots, the method comprising the steps of:

forming a field oxide structure on a substrate such that the field oxide structure has an inner peripheral edge surrounding a photodiode region;

forming a polysilicon structure adjacent to the inner peripheral edge of the field oxide structure;

depositing a spacer material over the polysilicon structure, the field oxide structure and the photodiode region;

forming a mask over an interface between the field oxide structure and the photodiode region; and etching the spacer material to form sidewall spacers on the polysilicon structure;

wherein the mask prevents etching of the spacer material located over the inner peripheral edge of the field oxide structure.

8. The method according to claim 7, wherein the mask extends a lateral distance from the inner peripheral edge of the field oxide structure over the photodiode region, and wherein the lateral distance is greater than 0.5 µm.

9. The method according to claim 7, wherein the step of etching the spacer material comprise using a plasma etching process.

10. A method for fabricating a CMOS image sensor to minimize the occurrence of white spots, the method comprising the steps of:

forming a field oxide structure on a substrate such that the field oxide structure has an inner peripheral edge surrounding a photodiode region;

lightly doping the photodiode region;

forming an oxide portion over an interface between the field oxide structure and the photodiode region, wherein the oxide portion is formed such that a central portion of the photodiode region of the substrate is exposed; and heavily doping the exposed central portion of the photodiode region, wherein the oxide portion prevents heavy doping of a peripheral portion of the photodiode region located between the central portion and the inner peripheral edge of the field oxide structure.

11. The method according to claim 10, wherein the oxide portion extends a lateral distance from the inner peripheral edge of the field oxide structure over the photodiode region, and wherein the lateral distance is greater than 0.5 µm.

12. A method for fabricating a CMOS image sensor to minimize the occurrence of white spots, the method comprising the steps of:

forming a field oxide structure on a substrate such that the field oxide structure has an inner peripheral edge surrounding a photodiode region;

doping the photodiode region;

depositing an insulating material over the field oxide structure and the photodiode region;

etching the insulating material to define a via such that a contact portion of the photodiode region is exposed; and forming a metal contact structure that extends through the opening and contacts the photodiode region at the contact portion, wherein the step of etching the insulating material is performed such that the via is located a lateral distance of 0.4 µm or greater from the inner peripheral edge of the field oxide structure.

13. The method according to claim 12, wherein the step of etching the insulating material comprises using a plasma etching process.

14. A method for fabricating a CMOS image sensor to minimize the occurrence of white spots, the method comprising the steps of:

forming a photodiode array including a plurality of pixels;

depositing metal over the photodiode array; and etching the metal to define a plurality of metal lines for transmitting electrical signals between selected pixels of the photodiode array;

wherein the step of etching the metal material is performed such that the plurality of metal lines have a width of 30 µm or greater, and include longitudinal slits.

15. The method according to claim 14, wherein the step of etching the metal comprises forming longitudinal slits such that they are 2.5 µm or greater.

16. The method according to claim 14, wherein the step of etching the metal comprises forming longitudinal slits such that a maximum distance between coaxial slits is 10 µm, and a maximum distance between any two parallel slits is 10 µm.

17. The method according to claim 14, wherein the step of etching the metal comprises forming the longitudinal slits such that a minimum clearance between any slit and an edge of metal line is 10 µm.

18. A method for fabricating a CMOS image sensor to minimize the occurrence of white spots, the method comprising the steps of:

forming a guard ring diffusion in a substrate, the guard ring diffusion being formed around a photodiode region and having first and second sections forming a corner;

forming a pixel array in the photodiode region;

depositing metal over the guard ring diffusion; and etching the metal to define a first metal line segment and a second metal line segment that are respectively located over the first and second sections of the guard ring diffusion and include ends that extend over the corner defined by the guard ring diffusion;

wherein the step of etching the metal is performed such that a gap is formed between the ends of the first metal line segment and the second metal line segment.

19. The method according to claim 18, wherein the step of etching the metal comprises forming the gap such that a minimum clearance between the first metal line segment and the second metal line segment is 0.7 µm.

* * * * *